(12) United States Patent
Nishijima

(10) Patent No.: US 8,633,527 B2
(45) Date of Patent: Jan. 21, 2014

(54) SEMICONDUCTOR DEVICE HAVING FIRST AND SECOND RESISTANCE FOR SUPPRESSING LOOP OSCILLATION

(75) Inventor: Masaaki Nishijima, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/607,569

(22) Filed: Sep. 7, 2012

(65) Prior Publication Data

US 2013/0001662 A1  Jan. 3, 2013

Related U.S. Application Data

(63) Continuation of application No. PCT/JP2010/006039, filed on Oct. 8, 2010.

(30) Foreign Application Priority Data

Mar. 9, 2010  (JP) ................................. 2010-051232

(51) Int. Cl.
*H01L 27/088* (2006.01)

(52) U.S. Cl.
USPC .......................................... 257/296; 257/379

(58) Field of Classification Search
CPC ............ H01L 27/088; H03F 3/60; H03F 3/68
USPC ...................................... 257/296, 379, E27.06
See application file for complete search history.

(56) References Cited

U.S. PATENT DOCUMENTS

2002/0063602 A1 * 5/2002 Asada ............................ 330/296

FOREIGN PATENT DOCUMENTS

| JP | 62-292007 A | 12/1987 |
|---|---|---|
| JP | 63-246014 A | 10/1988 |
| JP | 05-075357 A | 3/1993 |
| JP | 07 07626 A | 11/1995 |
| JP | 09-139639 A | 5/1997 |
| JP | 09-139639 A | 5/1997 |
| JP | 63-246014 A | 10/1998 |
| JP | 2001-148616 A | 5/2001 |
| JP | 2001-185966 A | 7/2001 |
| JP | 2001-185966 A | 7/2001 |
| JP | 2007-158648 A | 6/2007 |
| JP | 2008-022253 A | 1/2008 |

OTHER PUBLICATIONS

International Search Report, and English translation thereof, issued in International Patent Application No. PCT/JP2010/006039 dated Dec. 14, 2010.
Ikeda, Yukio et al. "C-Band High Power High Efficiency GaAs FET Amplifier." Shingaku-giho (Technical Report of IEICE). MW-88-52, pp. 1-5. 1988.

* cited by examiner

*Primary Examiner* — Walter H Swanson
(74) *Attorney, Agent, or Firm* — McDermott Will & Emery LLP

(57) ABSTRACT

A semiconductor device includes: a semiconductor element; a divider connected with an input portion of the semiconductor element; and a combiner connected with an output portion of the semiconductor element. The divider is disposed on a substrate and has a first divider portion including a first transmission line and a second transmission line, a second divider portion including a third transmission line and a fourth transmission line, and a first resistance and a second resistance respectively connected to both the first transmission line and the third transmission line. The first resistance is disposed in the space between the first and third transmission lines, the second resistance is disposed in the space between the first and third transmission lines, and the first resistance is disposed between the second resistance and the semiconductor element.

12 Claims, 13 Drawing Sheets

US 8,633,527 B2

SEMICONDUCTOR DEVICE HAVING FIRST AND SECOND RESISTANCE FOR SUPPRESSING LOOP OSCILLATION

CROSS-REFERENCE TO RELATED APPLICATION

This is a continuation of PCT International Application PCT/JP2010/006039 filed on Oct. 8, 2010, which claims priority to Japanese Patent Application No. 2010-051232 filed on Mar. 9, 2010. The disclosures of these applications including the specifications, the drawings, and the claims are hereby incorporated by reference in their entirety.

BACKGROUND

The present disclosure relates to semiconductor devices used in the microwave band and the millimeter-wave band, and more particularly to high-output power amplifiers.

With the recent higher-speed, larger-amount data communication, it is increasingly requested to increase the operating frequency and output of power amplifiers used in applications in the communication field, etc. In this relation, vigorous efforts are being made toward enhancement in the performance of transistors that are key devices of the power amplifiers.

A power amplifier used in the microwave band and the millimeter-wave band has a transistor such as a field effect transistor (FET) and matching circuits for matching a signal with the input/output impedances of the transistor. A general transistor has a number of linear fingers arranged in a comb shape. To achieve higher output, it is generally attempted to increase the total gate width by increasing the number of linear fingers of the FET and by combining some fingers into a unit to implement a multi-cell transistor.

As the size of the transistor is made larger, it becomes no more negligible in comparison with the millimeter-wave wavelengths. Therefore, the transistor must be handled as a distributed constant element. Specifically, when the size of the transistor is about one twentieth of the wavelength or larger, the transistor must be handled as a distributed constant element.

When the element size becomes larger than the above criterion for achievement of higher output, it is necessary to provide circuits for phase matching of a high-frequency signal at input/output portions of the transistor. Specifically, a circuit having a function of dividing the high-frequency signal for supply of power to the transistor and a circuit having a function of combining output signals of the transistor are provided at the input/output portions.

FIG. 12 shows an example (e.g., see Yukio Ikeda, et al, C-Band High-Output, High-Efficiency GaAs FET Amplifier, Shingaku-giho (Technical Report of IEICE), MW-88-52, 1-5 (1988), Japanese Patent Publication No. H07-307626, Japanese Patent Publication No. 2008-022235, and Japanese Patent Publication No. 2001-185966). In FIG. 12, a two-stage impedance transformer made of microstrip lines is used as the input/output matching circuits. A microwave power amplifier of FIG. 12 includes a FET 1 and an input matching circuit 5 and an output matching circuit 8 respectively placed at input and output portions of the FET 1. Metal wires 9 electrically connect the input matching circuit 5 with the FET 1 and connect the output matching circuit 8 with the FET 1. The input matching circuit 5 is made of a microstrip line 2 formed on a dielectric substrate 3 made of alumina, etc., and an input terminal 4 is connected to one end of the microstrip line 2. The length and characteristic impedance of the microstrip line 2 are set at values with which the input impedance of the FET 1 can match with the impedance of the power supply connected to the input terminal 4. Normally, the length is set to be a quarter wavelength of a desired frequency, and the characteristic impedance is set to be the geometric mean value of the input impedance of the FET 1 and the power supply impedance. In this way, the input matching circuit 5 is a one-stage impedance transformer made of the microstrip line 2 that serves to match the input impedance of the FET 1 with the power supply impedance and has a length of a quarter wavelength.

The output matching circuit 8 is made of a microstrip line 6 formed on the dielectric substrate 3, and an output terminal 7 is connected to one end of the microstrip line 6. The output matching circuit 8 is provided to match the output impedance of the FET 1 with the load impedance connected to the output terminal 7. The length of the microstrip line 6 is set to be a quarter wavelength, and the characteristic impedance is set to be the geometric mean value of the output impedance of the FET 1 and the load impedance. In this way, like the input matching circuit 5, the output matching circuit 8 is a one-stage impedance transformer made of the microstrip line 6 having a length of a quarter wavelength.

A microwave signal input at the input terminal 4 of the microwave power amplifier passes through the input matching circuit 5 to be supplied to the FET 1. The supplied microwave signal is amplified by the FET 1 and output at the output terminal 7 through the output matching circuit 8. Thus, in the microwave power amplifier, the FET 1 having a gate width with which desired output power is obtained is used, and the input matching circuit 5 and the output matching circuit 8 that respectively match the input impedance of the FET 1 with the power supply impedance and the output impedance of the FET 1 with the load impedance are provided at the input/output portions of the FET1.

When the chip size of the FET 1 becomes too large to be negligible in comparison with the wavelength, a phase difference and an amplitude difference occur in a high-frequency signal that passes through the input matching circuit for the FET 1, then through various parts of the FET 1, and is output from the FET 1 as shown in FIGS. 13A-13C, reducing the combining efficiency. This prevents achievement of higher output and higher gain.

As one means for suppressing or reducing the phase difference and the amplitude difference in the high-frequency signal for the FET 1, the high-frequency signal is divided by dividing the microstrip line into a plurality of lines, to supply the signal with suppressed or reduced phase difference and amplitude difference to the FET. FIG. 14A shows an example of such an amplifier, which is configured as follows. A RF signal input at an input terminal 14 is divided through equivalent input matching circuits 2a, 2b, and 2c that have transmission lines formed on an alumina substrate and plate capacitors formed on a high-dielectric substrate to be supplied to FET chips 1. RF signals amplified by the FET chips 1 are combined through equivalent output matching circuits 6a and 6b that have transmission lines formed on the alumina substrate, to be output at an output terminal 15. Input-side resistors 10 (input-side inter-chip resistors) and output-side resistors 11 (output-side inter-chip resistors), which are thin film resistances formed on the dielectric substrate, are respectively provided in portions of the space between the transmission lines constituting the equivalent input matching circuits 2a, 2b, and 2c and in portions of the space between the transmission lines constituting the equivalent output matching circuits 6a and 6b, which are opposed in inter-chip closed loop circuits, and connected to the transmission lines.

As shown in FIG. 14B, by providing the input-side resistors 10 and the output-side resistors 11 in parallel in the loops, odd-mode oscillation power a between two chips and odd-mode oscillation power β between four chips can be absorbed by the input-side resistors 10 and the output-side resistors 11, achieving stabilization of the amplifier.

SUMMARY

The conventional method described above where resistors are provided in the divider of the semiconductor device fails in completely suppressing loop oscillation. This results in generation of an unwanted wave at the time of application of power supply and a high-frequency signal to the transistor, causing unstable operation and thus obstructing achievement of high-output operation and high-gain operation.

It is an objective of the present disclosure to provide a power amplifier operating with high output and high gain where unstable operation is suppressed or reduced.

Specifically, the first example semiconductor device includes: a semiconductor element; a divider connected to an input portion of the semiconductor element; and a combiner connected to an output portion of the semiconductor element, wherein the divider is disposed on a substrate and has a first divider portion including a first transmission line and a second transmission line, a second divider portion including a third transmission line and a fourth transmission line, and a first resistance and a second resistance respectively connected to both the first transmission line and the third transmission line, the first transmission line is disposed between the second transmission line and the semiconductor element, the third transmission line is disposed between the fourth transmission line and the semiconductor element, the first transmission line and the third transmission line are disposed in parallel with space therebetween, the first resistance is disposed in the space between the first transmission line and the third transmission line, the second resistance is disposed in the space between the first transmission line and the third transmission line, and the first resistance is disposed between the second resistance and the semiconductor element.

According to the first semiconductor device, unstable operation can be suppressed substantially completely, permitting implementation of a power amplifier capable of operating with high output and high gain.

In the first semiconductor device, the divider may have a third resistance disposed between the first resistance and the second resistance. With such a configuration, unstable operation can further be suppressed.

In the first semiconductor device, the substrate may be a semiconductor substrate, and the semiconductor element may be disposed integrally with the divider on the substrate. Alternatively, the substrate may be a dielectric substrate.

The first semiconductor device may further include: an input terminal disposed on the substrate; a main line connecting the input terminal with the divider; and a microstrip line extending in a direction intersecting with the main line and having a plurality of radial stubs, wherein the semiconductor element is a field effect transistor having a gate terminal as the input portion, the divider is connected with the gate terminal, the second transmission line and the fourth transmission line are connected with an end of the main line opposite to an end thereof connected with the input terminal, and both ends of the microstrip line are each a gate bias terminal.

In the case described above, the semiconductor device may further include: a bias resistance connected with the gate bias terminal; and a dielectric capacitor connected with the gate bias terminal via the bias resistance.

The second example semiconductor device includes: a semiconductor element; a divider connected with an input portion of the semiconductor element; and a combiner connected with an output portion of the semiconductor element, wherein the combiner is disposed on a substrate and has a first combiner portion including a first transmission line and a second transmission line, a second combiner portion including a third transmission line and a fourth transmission line, and a first resistance and a second resistance respectively connected to both the first transmission line and the third transmission line, the first transmission line is disposed between the second transmission line and the semiconductor element, the third transmission line is disposed between the fourth transmission line and the semiconductor element, the first transmission line and the third transmission line are disposed in parallel with space therebetween, the first resistance is disposed in the space between the first transmission line and the third transmission line, the second resistance is disposed in the space between the first transmission line and the third transmission line, and the first resistance is disposed between the second resistance and the semiconductor element.

According to the second semiconductor device, unstable operation can be suppressed substantially completely, permitting implementation of a power amplifier capable of operating with high output and high gain.

In the second semiconductor device, the combiner may have a third resistance disposed between the first resistance and the second resistance. With such a configuration, unstable operation can further be suppressed.

In the second semiconductor device, the substrate may be a semiconductor substrate, and the semiconductor element may be disposed integrally with the combiner on the substrate. Alternatively, the substrate may be a dielectric substrate.

The second semiconductor device may further include: an output terminal disposed on the substrate; a main line connecting the output terminal with the combiner; and a microstrip line extending in a direction intersecting with the main line and having a plurality of radial stubs, wherein the semiconductor element is a field effect transistor having a drain terminal as the output portion, the combiner is connected with the drain terminal, the second transmission line and the fourth transmission line are connected with an end of the main line opposite to an end thereof connected with the output terminal, and both ends of the microstrip line are each a drain bias terminal.

According to the semiconductor device of this disclosure, a high-output, high-gain power amplifier in the microwave band and the millimeter-wave band can be especially implemented.

BRIEF DESCRIPTION OF THE DRAWINGS

FIG. 1A shows the entire of the semiconductor device and FIG. 1B is an enlarged view of a divider.

DETAILED DESCRIPTION

First Embodiment

Figure 1A:
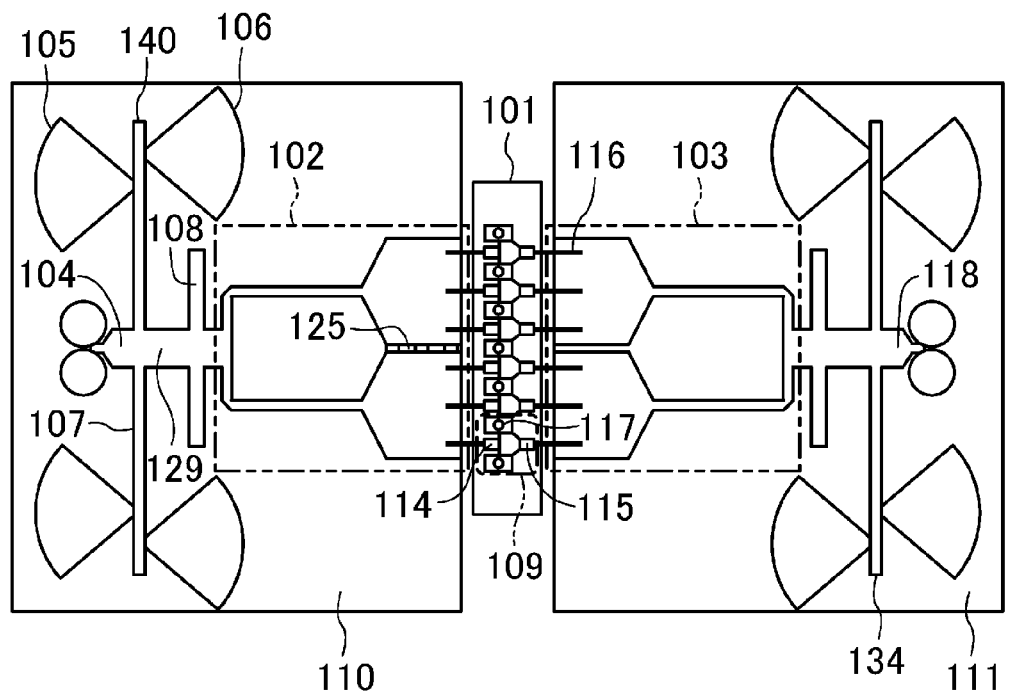
FIGS. 1A and 1B are plan views of a semiconductor device of the first embodiment, where

As shown in FIG. 1, an example semiconductor device is a millimeter-wave power amplifier, which includes a FET 101, and a divider 102 and a combiner 103 respectively provided at the input portion and the output portion of the FET 101. Between an input terminal 104 and the divider 102, formed are a microstrip line 107 with a first radial stub 105 and a second radial stub 106 connected thereto and an open stub 108. Similar components are also formed between an output terminal 118 and the combiner 103.

The FET 101 is a gallium-nitride (GaN) heterojunction transistor formed on a silicon substrate. It is preferable that the silicon substrate have a high resistivity, specifically, a resistivity as high as 1 kΩ·cm or more. The thickness of the silicon substrate may be 100 μm. The total gate width of the FET 101 is 2700 μm. Specifically, a basic cell 109 having a gate width of 450 μm is formed of six gate fingers each having a length of 75 μm, and six such basic cells 109 are connected in parallel. The dimension of the FET 101 in the longitudinal direction is approximately 1.65 mm. In power amplifiers operating in the quasi-millimeter wave (10 GHz to 30 GHz) frequency band and the millimeter-wave frequency band, in particular, the size of the fingers of the transistor and the orientation of arrangement of the fingers are no more negligible with respect to an electrical length of the quarter wavelength of the signal wave transmitted.

The divider 102 and the combiner 103 are respectively formed on dielectric substrates 110 and 111 that are made of alumina, etc. and have a dielectric constant of about 10. The quarter wavelength of a frequency of 25 GHz on the dielectric substrates 110 and 111 is approximately 1.0 mm. The distance between the center of the FET 101 and an end thereof is approximately 0.8 mm, which is not negligible in comparison with the quarter wavelength, i.e., approximately 1.0 mm.

Figure 1B:
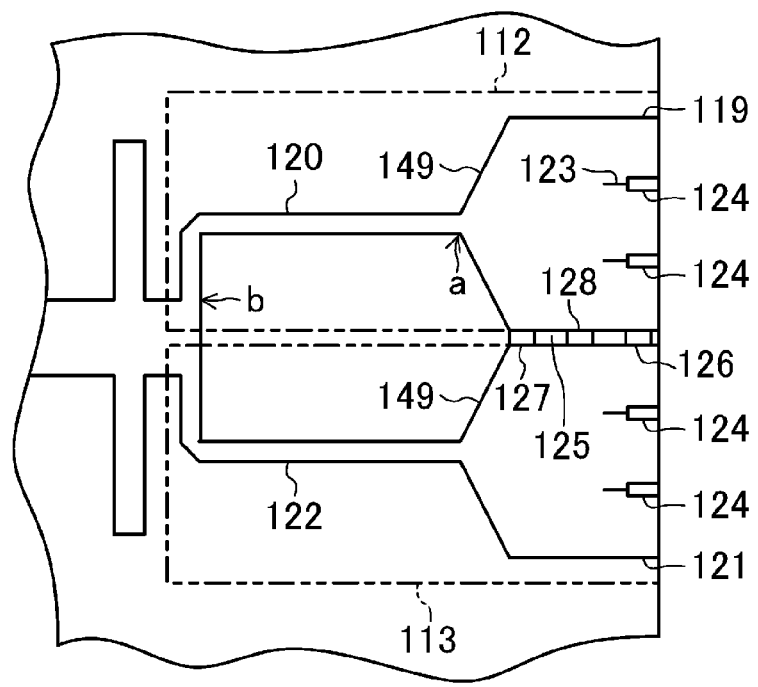

The divider 102 has a first divider portion 112 and a second divider portion 113 as shown in FIG. 1B. The divider 102 and the combiner 103 are respectively connected with gate pads 114 and drain pads 115 of the FET 101 via gold wires 116. The sources of the FET 101 are connected to a backside electrode via via holes 117. Two via holes 117 are formed for each basic cell 109 for reducing the source inductance to improve the gain.

The divider 102 and the combiner 103 respectively function as input and output matching circuits. A millimeter-wave signal input at the input terminal 104 of the microwave power amplifier passes through the divider 102 to be supplied to the FET 101. The supplied microwave signal is amplified by the FET 101 and output at the output terminal 118 through the combiner 103.

In the first divider portion 112, a first signal line 119 and a second signal line 120 as microstrip lines are connected in series via a tapered portion 149. In the second divider portion 113, a third signal line 121 and a fourth signal line 122 as microstrip lines are connected in series via a tapered portion 149. The length of the first and third signal lines 119 and 121 is 640 μm, and the length of the second and fourth signal lines 120 and 122 is 1440 μm. The length of the second signal line 120 refers to the distance from point a to point b shown in FIG. 1B.

On the dielectric substrate 111 on the output side, the length of lines corresponding to the first and third signal lines 119 and 121 is 760 μm, and the length of lines corresponding to the second and fourth signal lines 120 and 122 is 1305 μm.

Figure 2:
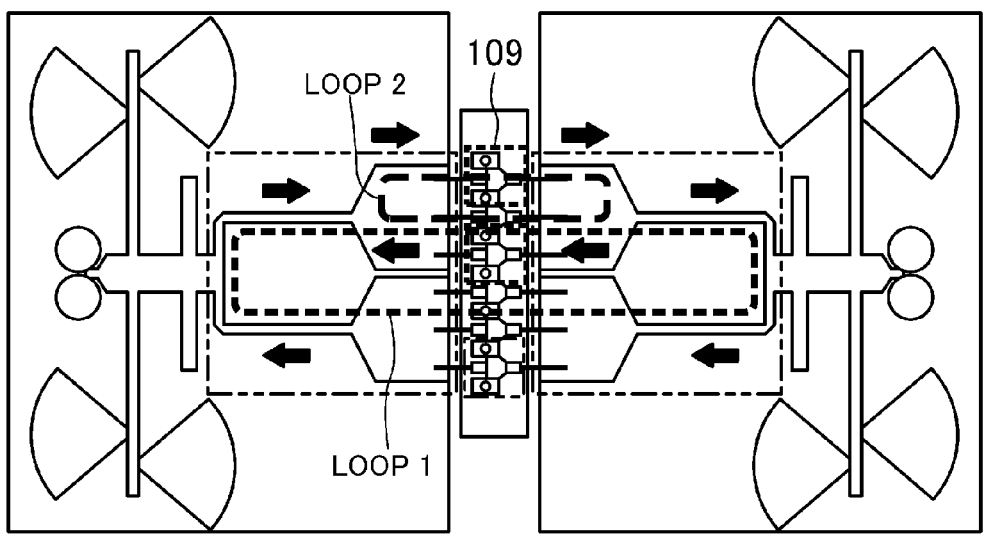
FIG. 2 is a plan view for explaining loop oscillation occurring in the semiconductor device of the first embodiment.

In such a configuration, there is the possibility that oscillation may occur due to two kinds of loops as shown in FIG. 2. Loop 1 is a large loop surrounding the divider 102 and the combiner 103. Loop 2 is a small loop involving two adjacent basic cells 109. Oscillation occurs when the amplitude is 1 or more and the phase rotation is an integer multiple of $2\pi$ (in a loop. Actually, when a DC bias is applied to input a 25 GHz-band high-frequency signal to the FET, an unwanted signal having a frequency of 25 GHz±n×F1±m×F2 (n, m are integers, F1 is an oscillating frequency caused by Loop 1, and F2 is an oscillating frequency caused by Loop 2) is observed.

In the example power amplifier, the oscillation caused by Loop 1 occurs in the 12 GHz band. It is expected that the oscillation could be suppressed or reduced by placing resistances at opposed positions in the loop to avoid the oscillating conditions. To suppress or reduce the oscillation caused by Loop 1, resistances 124 as metal thin film resistances made of tantalum nitride (TaN), nickel chrome (NiCr), etc. are placed to be opposed in the loop in three slits 123 formed in a side portion of the first signal line 119 closer to the FET 101 shown in FIG. 1B. Normally, the resistance value nearly corresponds to the actual resistance component of the input impedance of a pattern of two basic cells 109 combined, which is about 5Ω to 20Ω.

Figure 3A:
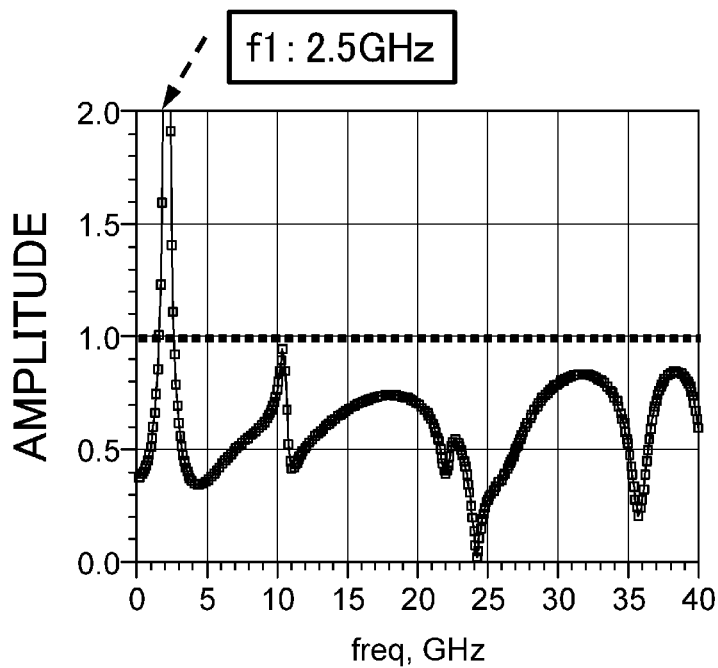
FIGS. 3A and 3B are graphs showing the simulation results of loop oscillation occurring when no resistance is placed in the semiconductor device of the first embodiment.
Figure 3B:
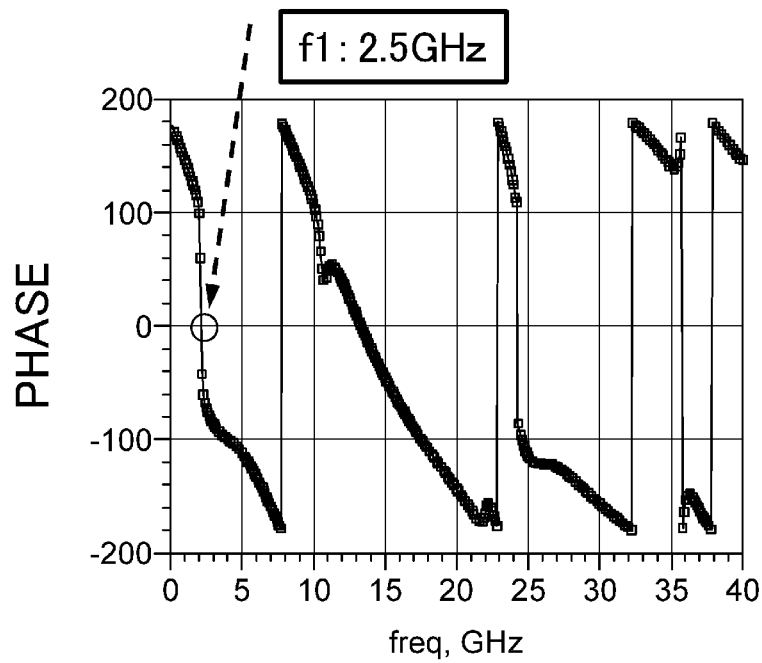
Figure 4:
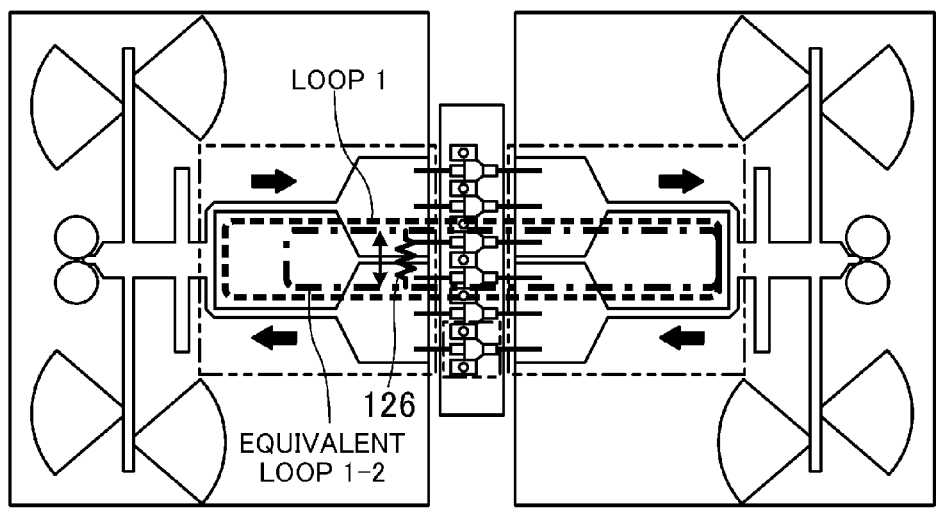
FIG. 4 is another plan view for explaining loop oscillation occurring in the semiconductor device of the first embodiment.

As a method of suppressing or reducing the oscillation caused by Loop 2, it is considered to place resistances in space 125 formed between the first signal line 119 and the third signal line 121. If no resistance is placed in the space 125, oscillation will occur at about the frequency of 2.5 GHz. FIGS. 3A and 3B show the simulation results of this loop oscillation. At about 2.5 GHz (f1), the amplitude exceeds 1 as shown in FIG. 3A and the phase rotation becomes 360° as shown in FIG. 3B, satisfying the oscillation conditions. Note that, although the phase rotation is 180° in FIG. 3B because the start point of the frequency for the simulation is not sufficiently low, it is virtually 360°.

If only a first resistance 126 is placed in a portion of the space 125 closer to the FET 101, the oscillation at about 2.5 GHz will vanish, but oscillation will newly occur in the 4 GHz band. That is, with the placement of the first resistance 126, the oscillation power at about 2.5 GHz will attenuate by being absorbed by the first resistance 126. However, with the placement of the first resistance 126, oscillation will newly occur in the 4 GHz band (f2) higher than 2.5 GHz. Note that the space 125 is 20 μm, the sheet resistance of the resistor is 20Ω/□, and the width of the first resistance 126 is set at 20 μm to 40 μm.

The new oscillation is considered to occur because new Equivalent Loop 1-2 shorter in peripheral length than Loop 1 from the standpoint of equivalence is generated by the placement of the first resistance 126. In order to suppress or reduce the new oscillation, a new resistance must be placed at a position in an end portion of Loop 1 (position away from the FET 101) with respect to the position of the first resistance 126, to absorb the oscillation power of Equivalent Loop 1-2.

Specifically, as shown in FIG. 1B, a second resistance 127 is placed, in the space between the first signal line 119 and the third signal line 121, at the end of the first signal line 119 opposite to the end thereof at which the first resistance 126 is placed, whereby the oscillation in the 4 GHz band can be suppressed or reduced. The width of the second resistance 127 is set at 20 μm to 40 μm.

Figure 5:
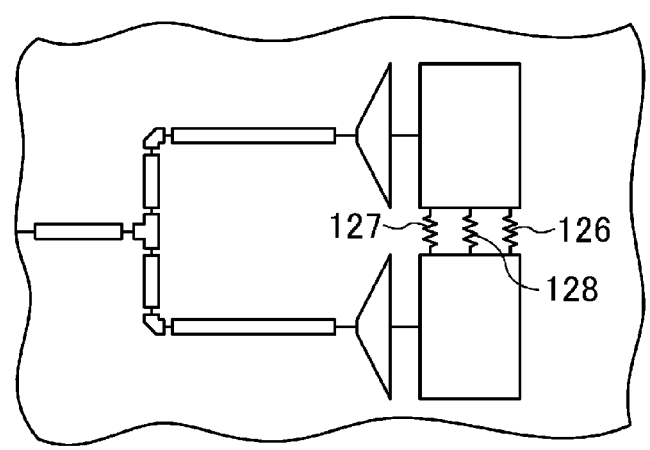
FIG. 5 is a plan view of the divider of the semiconductor device of the first embodiment.

FIG. 5 shows, by circuit symbols, the positional relationship among the first resistance 126, the second resistance 127, and a third resistance 128 inserted between the adjacent first and third signal lines 119 and 121 in the divider in FIG. 1B. Note that, although the configuration of FIG. 5 is for the divider in FIG. 1B, a similar configuration is also applicable to semiconductor devices shown in FIGS. 8-11.

Figure 6A:
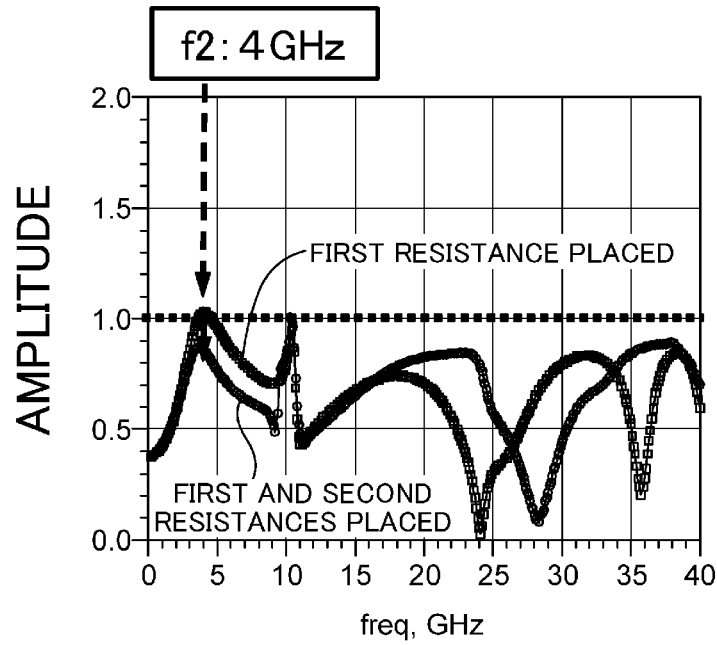
FIGS. 6A and 6B are graphs showing the simulation results of loop oscillation occurring when a second resistance is placed in the semiconductor device of the first embodiment.
Figure 6B:
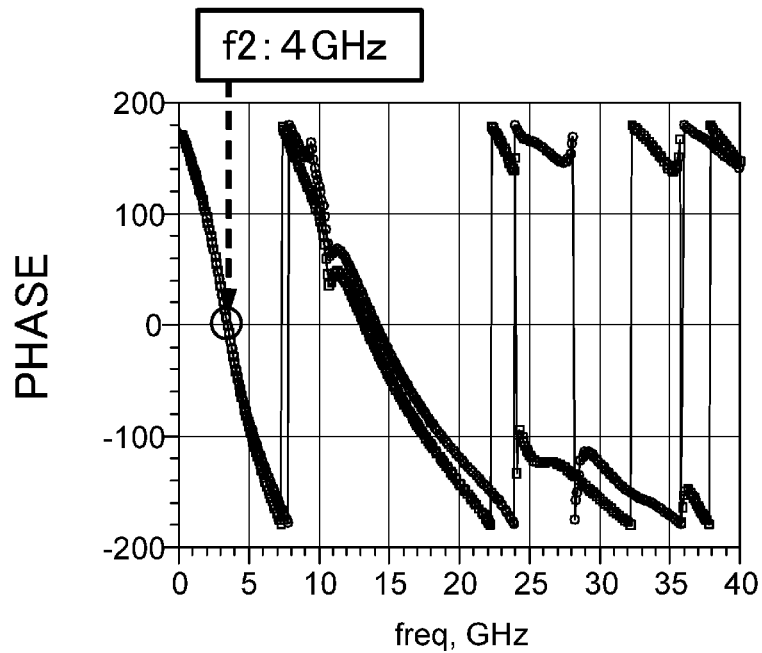

FIGS. 6A and 6B show the results of verification by simulation. With the placement of the first resistance 126, the amplitude exceeds 1 in the 4 GHz band as shown in FIG. 6A and the phase rotates 360° as shown in FIG. 6B, satisfying the oscillation conditions. Note that, although the phase rotation is 180° in FIG. 6B because the start point of the frequency of the simulation is not sufficiently low, it is virtually 360°. It is however found that, with the placement of the second resistance 127, the amplitude is reduced to less than 1, suppressing or reducing oscillation. In this embodiment, the third resistance 128 is further placed at a position between the first resistance 126 and the second resistance 127 as shown in FIG. 1B. With this placement of the third resistance 128, the effect of suppressing or reducing oscillation can further be improved. The third resistance 128 may be placed as required. The width of the third resistance 128 is set to be 20 μm to 40 μm.

Figure 7A:
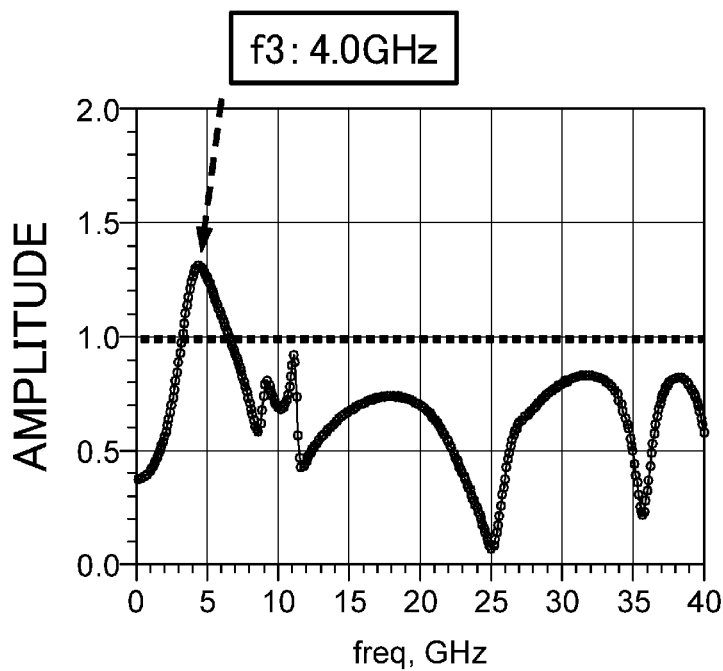
FIGS. 7A and 7B are graphs showing the simulation results of loop oscillation occurring when a resistance is placed in the entire space of the semiconductor device of the first embodiment.
Figure 7B:
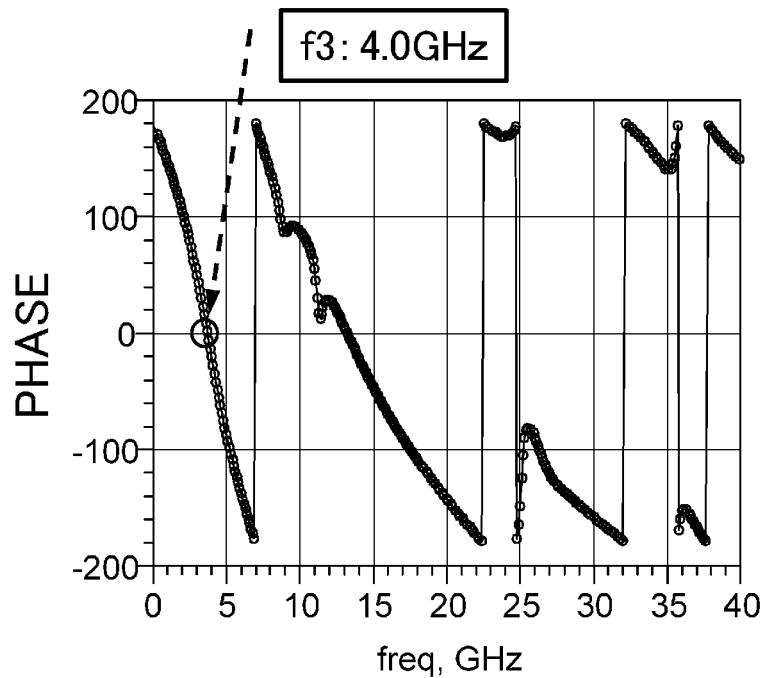

FIGS. 7A and 7B show the simulation results of loop oscillation observed when a resistance is placed over the entire space 125 between the first signal line 119 and the third signal line 121, where the resistance value is approximately 0.6Ω. The amplitude exceeds 1 in the 4 GHz band as shown in FIG. 7A and the phase rotates 360° as shown in FIG. 7B, satisfying the oscillation conditions. Note that, although the phase rotation is 180° in FIG. 7B because the start point of the frequency of the simulation is not sufficiently low, it is virtually 360°.

As described above, when a resistance is placed over the entire space 125, it is difficult to suppress or reduce loop oscillation. Instead, it is effective for suppression or reduction of loop oscillation to place resistances separately at the positions of the first and second resistances 126 and 127 and further at the position of the third resistance 128. This is applied when the length of the first signal line 119 and the third signal line 121 is longer than an electrical length of about one-fifth of the quarter wavelength in the frequency band used. When the length of the first signal line 119 and the third signal line 121 is shorter than an electrical length of about one-fifth of the quarter wavelength in the wavelength band used, it is virtually difficult to divide the resistance of a desired value into a plurality of resistances and place them.

Figure 8:
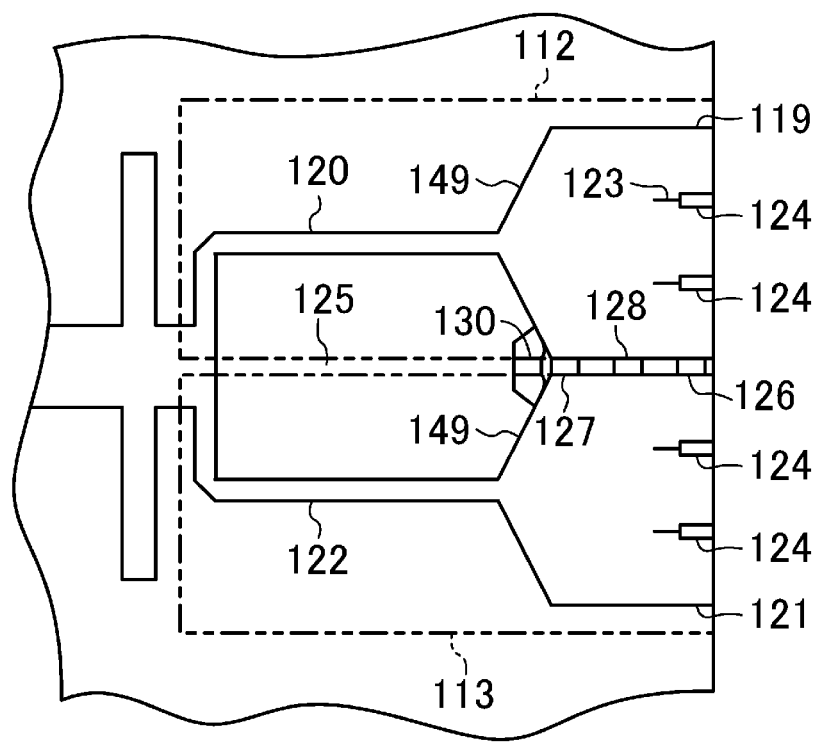
FIG. 8 is a plan view of the divider of the semiconductor device of the first embodiment with a resistance placed at tapered portions.

The first signal line 119 and the third signal line 121 take a role of a matching circuit as a one-stage impedance transformer, and the physical length thereof is normally set to be an electrical length of the quarter wavelength in the frequency band used. Depending on the impedance matching, however, the length may be set to be an electrical length of less than the quarter wavelength. In this case, as shown in FIG. 8, a fourth resistance 130 may be placed between the tapered portion 149 between the first signal line 119 and the second signal line 120 and the tapered portion 149 between the third signal line 121 and the fourth signal line 122, to obtain an effect similar to that described above.

The configuration in this embodiment is applicable, not only to the divider 102, but also to the combiner 103, and in the latter case, also, a similar effect can be obtained.

Further, in FIG. 1A, the microstrip line 107 with the first radial stub 105 and the second radial stub 106 connected thereto can function as a gate bias circuit, where a desired voltage may be applied at a gate bias terminal 140 closer to the radial stubs, to supply a gate bias to the FET 101.

Figure 9:
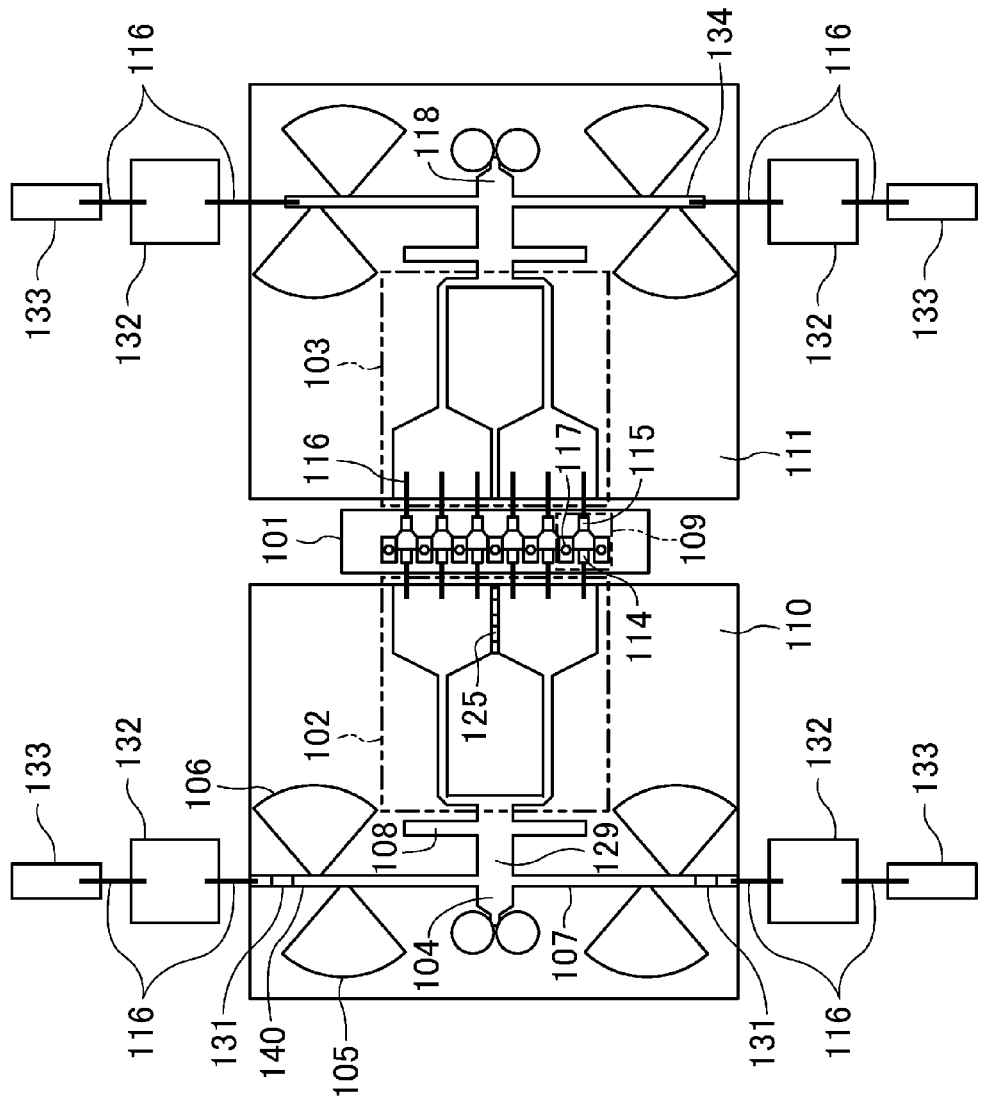
FIG. 9 is another plan view of the semiconductor device of the first embodiment.

FIG. 9 shows a gate bias circuit in this case. The length of the microstrip line 107 is approximately 1.0 mm that corresponds to the quarter wavelength of the frequency of 25 GHz on the dielectric substrates 110 and 111. Normally, the microstrip line 107 is nearly open at the connecting point with a main line 129 through which a high-frequency signal in the 25 GHz band passes. The pattern size of the first radial stub 105 is normally determined so that the radial stub be short-circuited in its connecting area with the microstrip line 107 when the frequency is 25 GHz, and the pattern size of the second radial stub 106 is determined so that the impedance be nearly short-circuited in its connecting area with the microstrip line 107 when the frequency is lower than 25 GHz. Therefore, it is possible to suppress or reduce leakage of a high-frequency signal from the main line 129 to the gate bias terminal 140 for a frequency of 25 GHz or less, and thus suppress or reduce unstable operation such as oscillation.

It is only necessary to connect the gate bias terminal 140 with a bias resistance 131, connect the bias resistance 131 with an upper electrode of a dielectric capacitor 132 via a gold wire 116, and then connect the upper electrode of the dielectric capacitor 132 with an external terminal 133. The dielectric capacitor 132 has a dielectric body having a desired dielectric constant and thickness, the upper electrode, and a lower electrode bonded to the ground. The dielectric capacitor 132 is normally selected to have a capacitance value of 100 pF or more. As the external terminal 133, a lead terminal of a package, a chip carrier, etc. is used. With the bias resistance 131, unstable operation such as an oscillation at a frequency lower than 25 GHz can be suppressed or reduced.

A pattern similar to the microstrip line 107 with the first radial stub 105 and the second radial stub 106 connected thereto is connected to the main line 129 symmetrically at the position opposite to the microstrip line 107 in the line width direction of the main line 129. If only the microstrip line 107 with the first and second radial stubs 105 and 106 connected thereto is connected to the main line 129, the equivalent phase plane of the traveling wave of a high-frequency signal passing through the main line 129 will have an influence from only the microstrip line 107 side, breaking the symmetry. This causes a deviation in phase between the high-frequency signal supplied to the first divider portion 112 and the high-frequency signal supplied to the second divider portion 113, obstructing achievement of uniform operation of the FET 101.

Although the first radial stub 105 and the second radial stub 106 are connected to the opposite sides of the microstrip line 107, they may be connected to the same side. Also, two or more radial stubs each may be connected.

The pattern size of the second radial stub 106, i.e., the radius and angle of the fan shape and the width of the connecting area with the microstrip line 107, may be the same as that of the first radial stub 105.

The microstrip line 107 with the first and second radial stubs 105 and 106 connected thereto, the bias resistance 131, and the dielectric capacitor 132 shown in FIG. 9 were described to constitute the gate bias circuit. However, the gate bias may be supplied from outside the input terminal 104 and not supplied from the external terminal 133, and in this case, also, a similar effect to that in the case of the gate bias circuit can be obtained.

Although description has been made on the gate bias circuit, a drain bias circuit can also be obtained by electrically connecting a drain bias terminal 134 to the upper electrode of the dielectric capacitor 132 via the gold wire 116 without use of the bias resistance 131 and further electrically connecting the upper electrode of the dielectric capacitor 132 to the external terminal 133. For suppression or reduction of unstable operation such as oscillation, a resistance element and a capacitor may be connected in series between the drain bias terminal 134 and the dielectric capacitor 132.

Although the gate bias terminal 140 and the drain bias terminal 134 are not placed on the same side with respective to the dielectric substrates 110 and 111, respectively, in FIG. 9, they may be placed on the same side.

Figure 10:
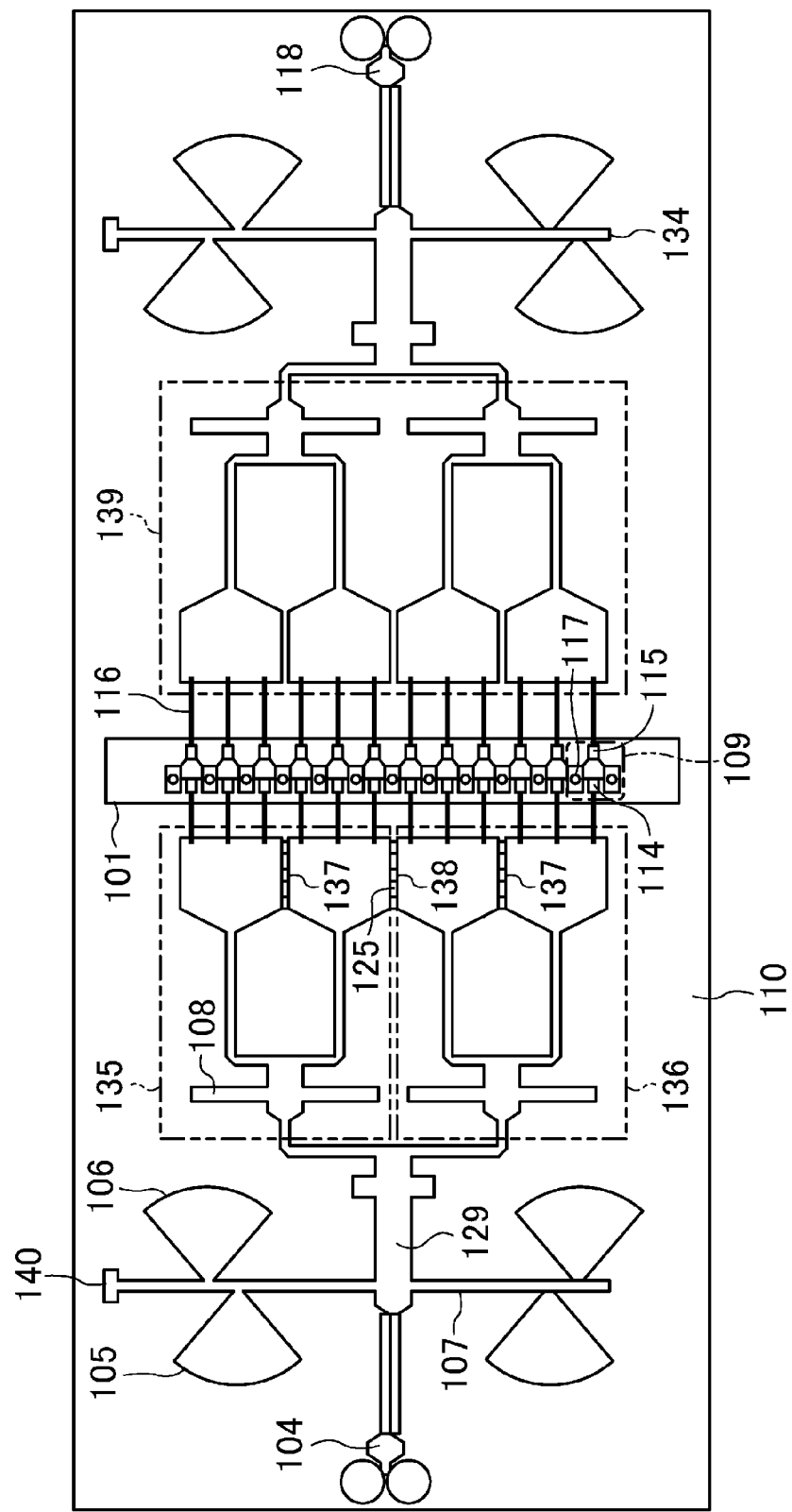
FIG. 10 is a plan view of a variation of the semiconductor device of the first embodiment.

FIG. 10 shows a layout of a power amplifier having an total gate width of 5400 μm. In FIG. 10, the FET 101 has 12 basic cells 109 connected in parallel. A first divider 135 and a second divider 136 are each formed based on the divider 102 described above for the total gate width of 2700 μm including the first and second divider portions 112 and 113. A loaded resistance 137 is formed in each of the first divider 135 and the second divider 136, and a loaded resistance 138 is formed between the first and second dividers 135 and 136. The loaded resistances 137 and 138 have a configuration similar to that in the power amplifier having the total gate width of 2700 μm described above, and have a similar effect.

In the above illustrated examples, the divider 102 and the combiner 103 are respectively formed on the dielectric substrate 110 and the dielectric substrate 111 that are different from the silicon substrate on which the FET 101 is formed. However, the divider 102 and the combiner 103 may be formed integrally on the silicon substrate on which the FET 101 is formed.

Second Embodiment

Figure 11:
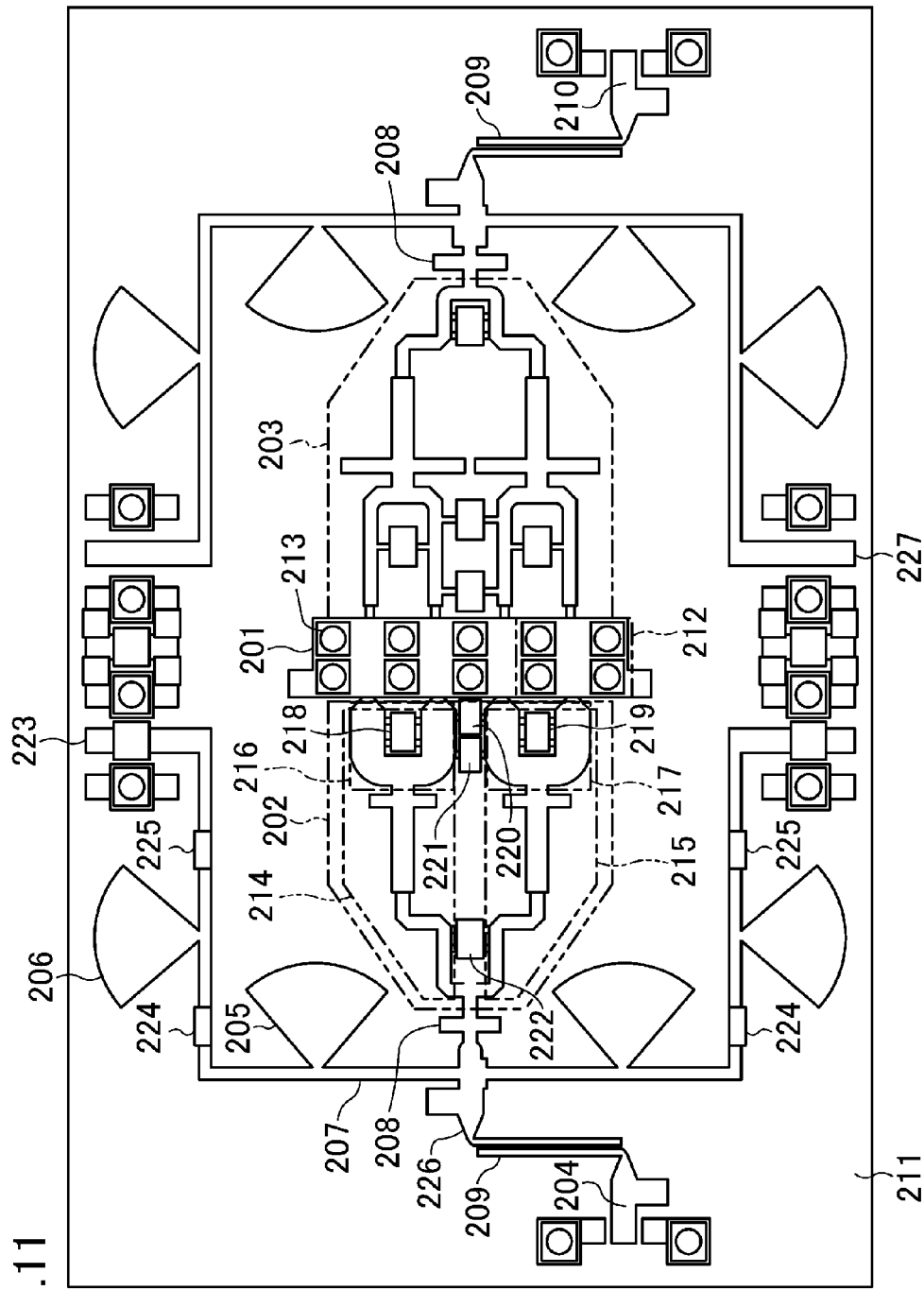
FIG. 11 is a plan view of a semiconductor device of the second embodiment.
Figure 12:
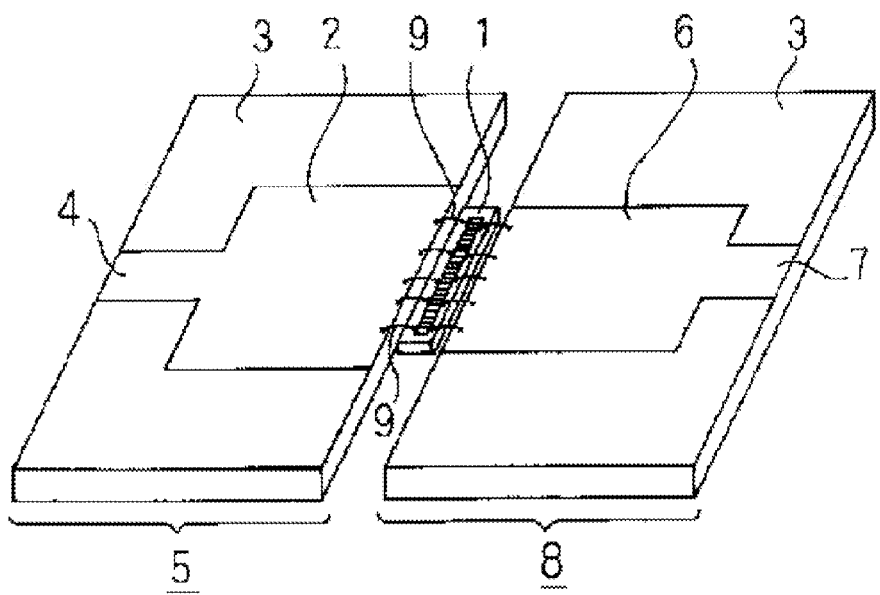
FIG. 12 is a perspective view showing a conventional semiconductor device.
Figure 13A:
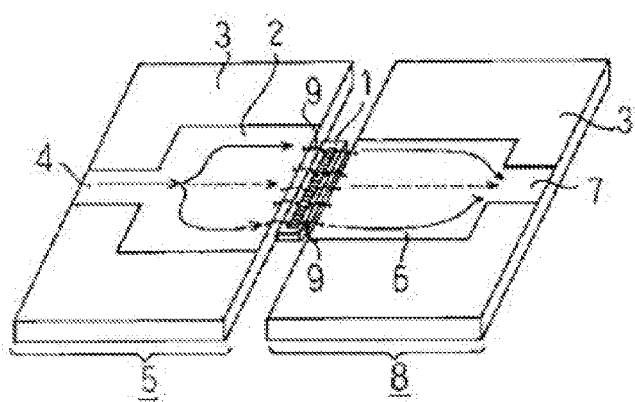
FIGS. 13A-13C are perspective views for explaining the states of a high-frequency signal in the conventional semiconductor device.
Figure 13B:
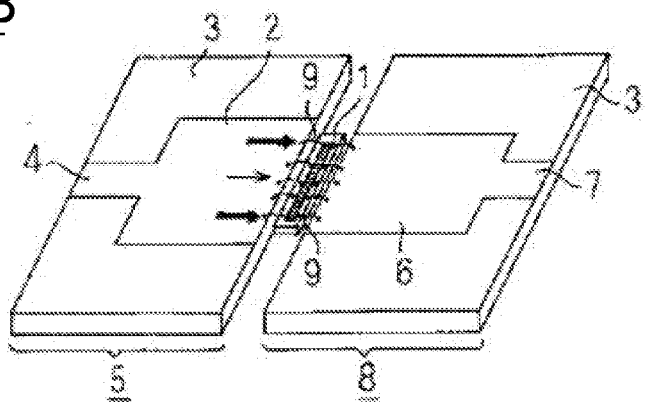
Figure 13C:
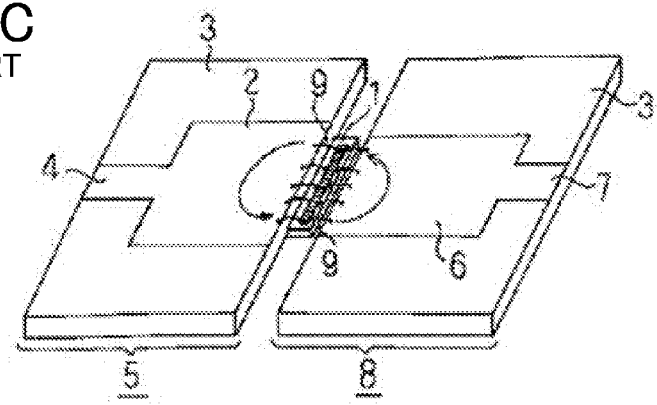
Figure 14A:
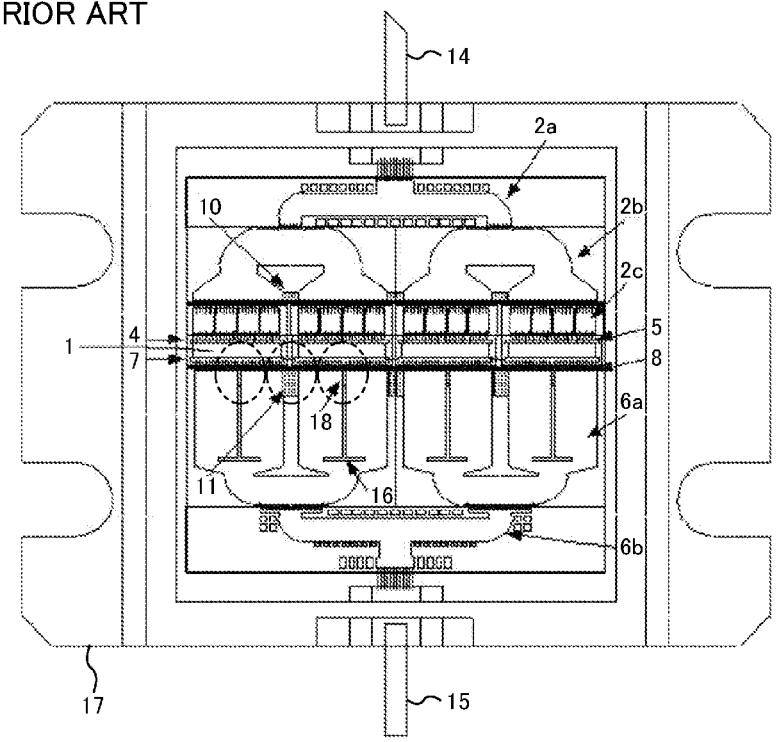
FIG. 14A is a plan view of a conventional semiconductor device.
Figure 14B:
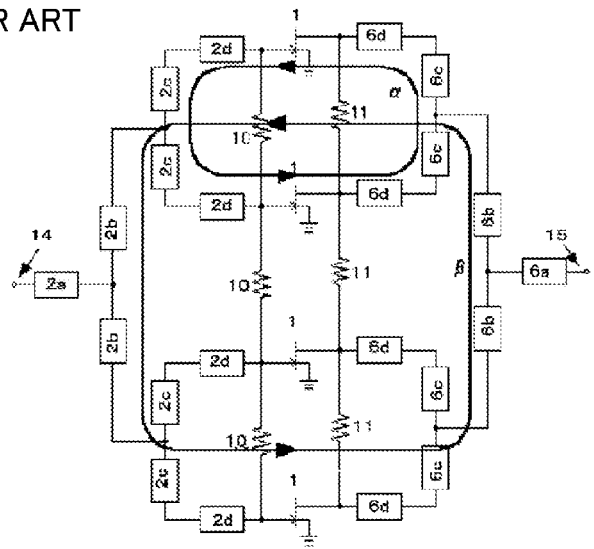
FIG. 14B is a circuit diagram for explaining loops in the conventional semiconductor device.

FIG. 11 shows a plan view of a semiconductor device of the second embodiment. A millimeter-wave power amplifier shown in FIG. 11 includes a FET 201, and a divider 202 and a combiner 203 respectively provided at the input and output portions of the FET 201. Between an input terminal 204 and the divider 202, formed are a microstrip line 207 with a first radial stub 205 and a second radial stub 206 connected thereto, an open stub 208, and a coupling line 209. Similar components are also formed between an output terminal 210 and the combiner 203.

The FET 201 and the other components are formed on a silicon substrate 211. It is preferable that the silicon substrate 211 have a high resistivity, specifically a resistivity as high as 1 kΩ·cm or more. The thickness of the silicon substrate may be about 100 μm. The FET 201 is a gallium-nitride (GaN) heterojunction transistor having a total gate width of 600 μm. Specifically, a basic cell 212 having a gate width of 150 μm is formed of two gate fingers each having a length of 75 μm, and four such basic cells 212 are connected in parallel. The sources are connected to a backside electrode via via holes 213. The via holes 213 are formed in pairs for reducing the source inductance. In this embodiment, the transmission frequency is 60 GHz, and the quarter wavelength on the silicon substrate 211 is approximately 0.42 mm. Therefore, the dimension of the FET 201 in the longitudinal direction is no more negligible with respect to an electrical length of the quarter wavelength of the signal wave transmitted.

The divider 202 has a first divider portion 214 and a second divider portion 215. The first divider portion 214 includes a third divider portion 216, and the second divider portion 215 includes a fourth divider portion 217.

The divider 202 and the combiner 203 respectively function as input and output matching circuits. A millimeter-wave signal input at the input terminal 204 of the millimeter-wave power amplifier passes through the divider 202 to be supplied to the FET 201. The supplied millimeter-wave signal is amplified by the FET 201 and output at the output terminal 210 through the combiner 203.

A resistance 218 and a resistance 219 are respectively placed in the third divider portion 216 and the fourth divider portion 217. The resistances 218 and 219 are each constituted by separate resistances placed at positions closer to and away from the FET 201 as described in the first embodiment. With this placement of the resistances, occurrence of loop oscillation in the third and fourth divider portions 216 and 217 can be suppressed or reduced.

Resistances 220, 221, and 222 are placed between the first divider portion 214 and the second divider portion 215. The resistances 220 and 221 are placed between the third divider portion 216 and the fourth divider portion 217 separately at positions closer to and away from the FET 201. The resistance 222 is placed between the first divider portion 214 and the second divider portion 215 at an end position away from the FET 201. With this placement of the resistances, occurrence of loop oscillation in the first and second divider portions 214 and 215 can be suppressed or reduced.

In order to place the resistance 222, the spacing between two microstrip lines to which both ends of the resistance 222 are connected is made narrower than the spacing between two microstrip lines extending from the FET 201 side by use of bend elements. With the spacing between the two microstrip lines extending from the FET 201 side in the first and second divider portions 214 and 215, it becomes necessary to provide new microstrip lines at both ends of the resistance 222 for connection of the resistance 222. Such microstrip lines newly provided at both ends of the resistance 222 functions as parallel open stubs for the main line, causing an influence on impedance matching. It is therefore preferable that the microstrip lines connected to both ends of the resistance 222 be as short as possible.

A similar effect will also be obtained when a resistance other than the resistance 222 is placed between the two microstrip lines to which both ends of the resistance 222 are connected.

In FIG. 11, the microstrip line 207 with the first radial stub 205 and the second radial stub 206 connected thereto functions as a gate bias circuit. A gate bias can be supplied to the FET 201 by applying a desired voltage to a gate bias terminal 223 closer to the radial stubs. Resistances 224 and 225 are respectively provided between the first radial stub 205 and the second radial stub 206 and between the second radial stub 206 and the gate bias terminal 223. With the placement of these resistances, unstable operation such as oscillation at a frequency lower than 60 GHz can be suppressed or reduced.

As in the first embodiment, a pattern similar to the microstrip line 207 with the first radial stub 205 and the second radial stub 206 connected thereto is connected to a main line 226 symmetrically at the position opposite to the microstrip line 207 in the line width direction of the main line 226.

The semiconductor device shown in FIG. 11 may also be provided with a gate bias circuit having a dielectric capacitor as shown in FIG. 9 placed externally. In this case, the gate bias may be supplied from outside the input terminal 204, or may be supplied from outside the input terminal 204 and not be supplied from the gate bias terminal 223.

The configuration in this embodiment is applicable to, not only the divider 202, but also the combiner 203, and a similar effect can be obtained.

In this embodiment, the divider 202 and the combiner 203 are formed integrally on the silicon substrate on which the FET 201 is formed. However, either one or both of the divider 202 and the combiner 203 may be formed on a dielectric substrate, etc. different from the silicon substrate on which the FET 201 is formed.

The present disclosure, related to semiconductor devices used in the microwave band and the millimeter-wave band, is particularly useful as high-output, high-gain power amplifiers.

What is claimed is:

1. A semiconductor device, comprising:
a semiconductor element;
a splitter connected to an input portion of the semiconductor element;
a combiner connected to an output portion of the semiconductor element;
an input terminal disposed on a substrate;
a first main line connecting the input terminal with the splitter; and
a first microstrip line extending in a direction intersecting with the first main line,
wherein the splitter is disposed on the substrate and has a first splitter portion including a first transmission line and a second transmission line, a second splitter portion including a third transmission line and a fourth transmission line, and a first resistance and a second resistance respectively connected to both the first transmission line and the third transmission line,
the first transmission line is disposed between the second transmission line and the semiconductor element,
the third transmission line is disposed between the fourth transmission line and the semiconductor element,
the first transmission line and the third transmission line are disposed in parallel with a space therebetween,
the first resistance is disposed in the space between the first transmission line and the third transmission line,
the second resistance is disposed in the space between the first transmission line and the third transmission line,
the first resistance is disposed between the second resistance and the semiconductor element,
the semiconductor element is a field effect transistor having a gate terminal as the input portion,
the splitter is connected with the gate terminal,
the second transmission line and the fourth transmission line are connected with an end of the first main line opposite to an end thereof connected with the input terminal, and
both ends of the first microstrip line are each a gate bias terminal.

2. The semiconductor device of claim 1, wherein the splitter has a third resistance disposed between the first resistance and the second resistance.

3. The semiconductor device of claim 1, wherein
the substrate is a semiconductor substrate, and
the semiconductor element is disposed integrally with the splitter on the substrate.

4. The semiconductor device of claim 1, wherein the substrate is a dielectric substrate.

5. The semiconductor device of claim 1, wherein
the first microstrip line has a plurality of radial stubs.

6. The semiconductor device of claim 1, further comprising:
a bias resistance connected with one of the gate bias terminals; and
a first dielectric capacitor connected with the one of the gate bias terminals via the bias resistance.

7. The semiconductor device of claim 1,
wherein the combiner is disposed on the substrate and has a first combiner portion including a fifth transmission line and a sixth transmission line, a second combiner portion including a seventh transmission line and a eighth transmission line, and a fourth resistance and a fifth resistance respectively connected to both the fifth transmission line and the seventh transmission line,
the fifth transmission line is disposed between the sixth transmission line and the semiconductor element,
the seventh transmission line is disposed between the eighth transmission line and the semiconductor element,
the fifth transmission line and the seventh transmission line are disposed in parallel with a space therebetween,
the fourth resistance is disposed in the space between the fifth transmission line and the seventh transmission line,
the fifth resistance is disposed in the space between the fifth transmission line and the seventh transmission line, and
the fourth resistance is disposed between the fifth resistance and the semiconductor element.

8. The semiconductor device of claim 7, wherein the combiner has a sixth resistance disposed between the fourth resistance and the fifth resistance.

9. The semiconductor device of claim 7, wherein
the semiconductor element is disposed integrally with the combiner on the substrate.

10. The semiconductor device of claim 7, further comprising:
an output terminal disposed on the substrate;
a second main line connecting the output terminal with the combiner; and
a second microstrip line extending in a direction intersecting with the second main line,
wherein
the field effect transistor has a drain terminal as the output portion,
the combiner is connected with the drain terminal,
the sixth transmission line and the eighth transmission line are connected with an end of the second main line opposite to an end thereof connected with the output terminal, and
both ends of the second microstrip line are each a drain bias terminal.

11. The semiconductor device of claim 10, wherein the second microstrip line has a plurality of radial stubs.

12. The semiconductor device of claim 10, further comprising:
a second dielectric capacitor connected with one of the drain bias terminals.

* * * * *